(12) United States Patent
Chen et al.

(10) Patent No.: US 11,063,569 B2
(45) Date of Patent: Jul. 13, 2021

(54) COMMON MODE NOISE SUPPRESSION FILTER

(71) Applicants: Inventec (Pudong) Technology Corp., Shanghai (CN); Inventec Corporation, Taipei (TW)

(72) Inventors: Yen-Hao Chen, Taipei (TW); Yo-Hao Cheng, Taipei (TW); Ding-Bing Lin, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 80 days.

(21) Appl. No.: 16/706,863

(22) Filed: Dec. 9, 2019

(65) Prior Publication Data
US 2021/0152152 A1 May 20, 2021

(30) Foreign Application Priority Data
Nov. 19, 2019 (CN) .......................... 201911137423.7

(51) Int. Cl.
| | |
|---|---|
| *H03H 7/42* | (2006.01) |
| *H02M 1/12* | (2006.01) |
| *H03H 1/00* | (2006.01) |
| *H03H 9/64* | (2006.01) |
| *H05K 1/02* | (2006.01) |

(52) U.S. Cl.
CPC .......... *H03H 7/427* (2013.01); *H03H 1/0007* (2013.01); *H02M 1/123* (2021.05); *H03H 9/6423* (2013.01); *H03H 2001/0085* (2013.01); *H05K 1/0225* (2013.01)

(58) Field of Classification Search
CPC .... H03H 9/6423; H03H 1/0007; H03H 7/427; H03H 2001/0085; H02M 2001/123; H05K 1/0225; H05K 1/0228
USPC .. 333/1, 4, 5, 175, 185, 204, 205, 236, 238, 333/245, 246
See application file for complete search history.

(56) References Cited

U.S. PATENT DOCUMENTS

| | | | |
|---|---|---|---|
| 6,956,444 B2 * | 10/2005 | Miller ................. | H05K 1/0216 333/12 |
| 10,411,670 B2 * | 9/2019 | Xing ..................... | H03H 1/0007 |
| 2004/0070468 A1 * | 4/2004 | Harada .................... | H01P 1/23 333/185 |
| 2011/0298563 A1 * | 12/2011 | Pai ...................... | H01P 1/20381 333/185 |

\* cited by examiner

*Primary Examiner* — Rakesh B Patel
*Assistant Examiner* — Jorge L Salazar, Jr.
(74) *Attorney, Agent, or Firm* — Winston Hsu

(57) ABSTRACT

A noise suppression filter includes a resonator, a ground plane, and a set of differential transmission lines. The set of differential transmission lines includes a first meander line and a second meander line formed in a first circuit layer. The resonator is formed in a second circuit layer and includes a first long arm, a second long arm, and a short arm extended form a same point to form a T-shape. The ground plane is formed in a third circuit layer and is coupled to the first long arm and the second long arm through vias. The first meander line is detoured along the inner sides of the first long arm and the short arm, and the second meander line is detoured along the inner sides of the second long arm and the short arm.

10 Claims, 5 Drawing Sheets

COMMON MODE NOISE SUPPRESSION FILTER

BACKGROUND OF THE INVENTION

Field of the Invention

The present invention is related to a filter, and more particularly to a common mode noise suppression filter.

Description of the Prior Art

In differential transmission, the signal transmitter will transmit two signals having the same amplitude but opposite phases through two transmission lines, and the signal receiver determines the logic state of the signals transmitted by the signal transmitter according to the voltage difference between the two signals. Since the signal receiver determines the logic state of the signals according to the voltage difference between the two differential signals instead of the actual voltages of the two signals, the influence of ambient noises on these two signals will be compensated, allowing the differential transmission to have better noise immunity.

However, the differential transmission can still be interfered by common mode noise. In prior art, the common-mode chokes are often used to suppress the common mode noise. However, the volume of common-mode chokes is too large, and the magnetic materials used in the common mode chokes are easily worn when operating at high frequency signals; therefore, the common mode chokes cannot be used in high-frequency circuits. In addition, the mushroom structure is also used to suppress the common mode noise in prior art. However, the mushroom type of resonance structure requires more circuit layers, which will require greater volume and higher cost for the multilayer circuit board. Furthermore, in order to meet the filtering frequency required for the second resonance mode, the mushroom type of resonance structure would require a greater electrical length by increasing the length of the meander line. However, the longer the meander line is, the more loss of differential mode signal the transmission will suffer, making it difficult to design a suitable filter.

SUMMARY OF THE INVENTION

One embodiment of the present invention discloses a noise suppression filter. The noise suppression filter includes a multi-layer circuit board, a resonator, a ground plane, and a set of differential transmission lines.

The multi-layer circuit board includes a first circuit layer, a second circuit layer, and a third circuit layer. The second circuit layer is disposed between the first circuit layer and the third circuit layer. The resonator is formed in the second circuit layer of the multi-layer circuit board and includes a first long arm, a second long arm, and a short arm. The first long arm, the second long arm, and the short arm are extended from a same point to form a T-shape. The ground plane is formed in the third circuit layer of the multi-layer circuit board, and is coupled to a terminal of the first long arm and a terminal of the second long arm through two vias.

The set of differential transmission lines is formed in the first circuit layer of the multi-layer circuit board, and includes a first meander line and a second meander line. The first meander line is detoured from a first input terminal along an inner side of the first long arm and a first inner side of the short arm to a first output terminal, and the second meander line is detoured from a second input terminal along an inner side of the second long arm and a second inner side of the short arm to a second output terminal.

Another embodiment of the present invention discloses a method for manufacturing a noise suppression filter. The method includes forming a set of differential transmission lines in a first circuit layer of a multi-layer circuit board, forming a resonator in a second circuit layer of the multi-layer circuit board, wherein the resonator includes a first long arm, a second long arm, and a short arm extended from a same point to form a T-shape, forming a ground plane in a third circuit layer of the multi-layer circuit board, and forming two vias coupled to the ground plane at a terminal of the first long arm and a terminal of the second long arm.

The second circuit layer is disposed between the first circuit layer and the third circuit layer, The set of differential transmission lines includes a first meander line detoured from a first input terminal along an inner side of the first long arm and a first inner side of the short arm to a first output terminal. The set of differential transmission lines further includes a second meander line detoured from a second input terminal along an inner side of the second long arm and a second inner side of the short arm to a second output terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
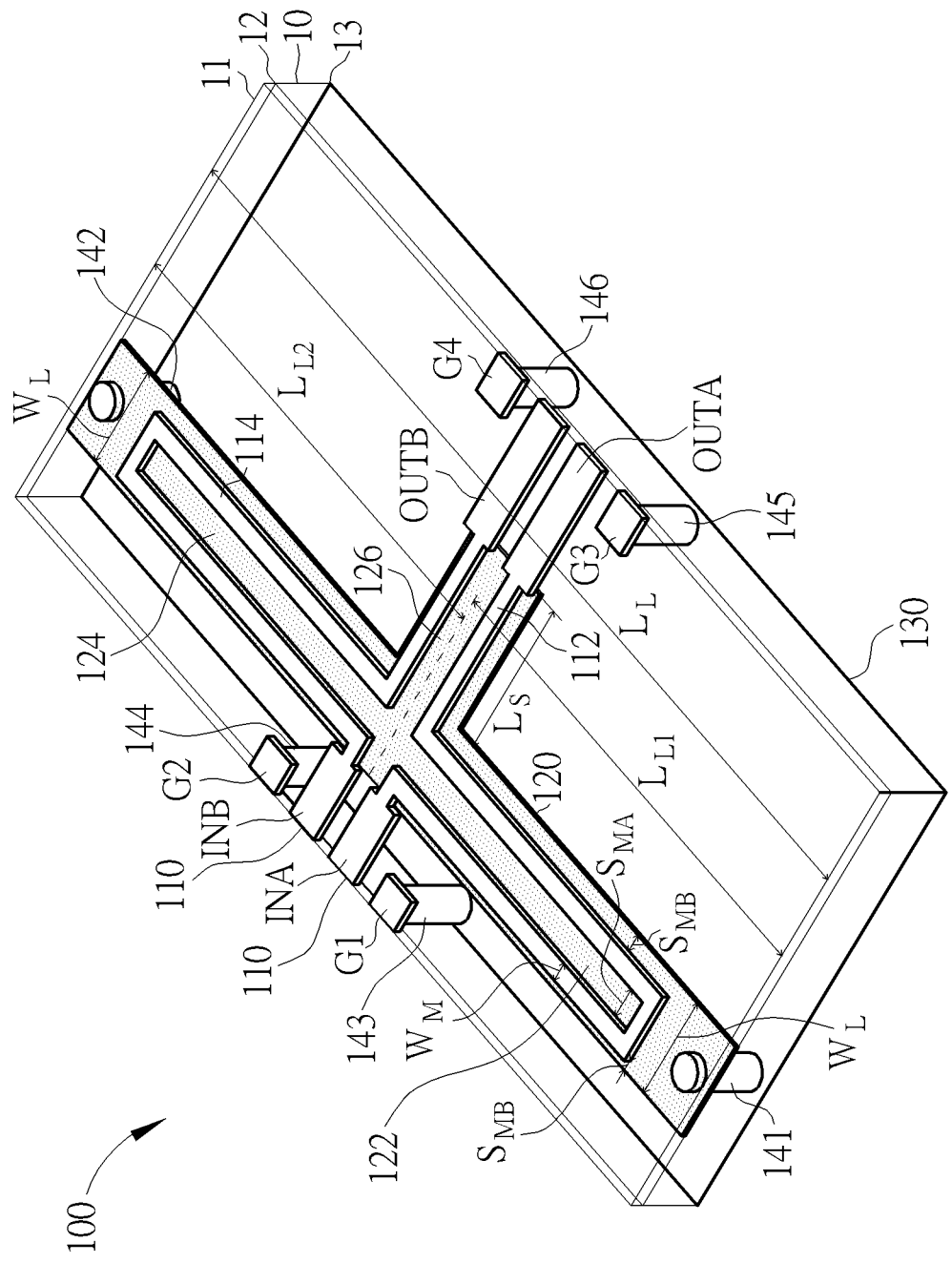
FIG. 1 shows a noise suppression filter according to one embodiment of the present invention.

FIG. 1 shows a noise suppression filter 100 according to one embodiment of the present invention. The noise suppression filter 100 can include a differential transmission line 110, a resonator 120, and a ground plane 130. The differential transmission line 110, the resonator 120, and the ground plane 130 can be respectively formed in the first circuit layer 11, the second circuit layer 12, and the third circuit layer 13. Also, the second circuit layer 12 is formed between the first circuit layer 11 and the third circuit layer 13.

In FIG. 1, the resonator 120 has a first long arm 122, a second long arm 124, and a short arm 126. The first long arm 122, the second long arm 124, and the short arm 126 are extended from the same point to form a T-shape. For example, the first long arm 122 and the second long arm 124 can be connected to form a long bar, and the short arm 126 can be connected to the center of the long bar, which is the connecting portion of the first long arm 122 and the second long arm 124, and stick out of the long bar vertically.

The set of differential transmission lines 110 can include a first meander line 112 and a second meander line 114. The first meander line 112 can be detoured from a first input terminal INA along an inner side of the first long arm 122 and a first inner side of the short arm 126 to a first output terminal OUTA. The second meander line 114 can be detoured from a second input terminal INB along an inner side of the second long arm 124 and a second inner side of the short arm 126 to a second output terminal OUTB. Furthermore, the ground plane 130 can be coupled to the terminals of the first long arm 122 and the second long arm 124 through via 141 and via 142.

In some embodiments, the noise suppression filter 100 can further include a first ground terminal G1, a second ground terminal G2, a third ground terminal G3, and a fourth ground terminal G4. The first ground terminal G1 is formed adjacent to the first input terminal INA, and can be coupled to the ground plane 130 through the via 143. The second ground terminal G2 is formed adjacent to the second input terminal INB, and can be coupled to the ground plane 130 through the via 144. The third ground terminal G3 is formed adjacent to the first output terminal OUTA, and can be coupled to the ground plane 130 through the via 145, and the fourth ground terminal G4 is formed adjacent to the second output terminal OUTB, and can be coupled to the ground plane 130 through the via 146. In FIG. 1, the first input terminal INA and the second input terminal INB can be disposed between the first ground terminal G1 and the second ground terminal G2. Also, the first output terminal OUTA and the second output terminal OUTB can be disposed between the third ground terminal G3 and the fourth ground terminal G4.

Figure 2:
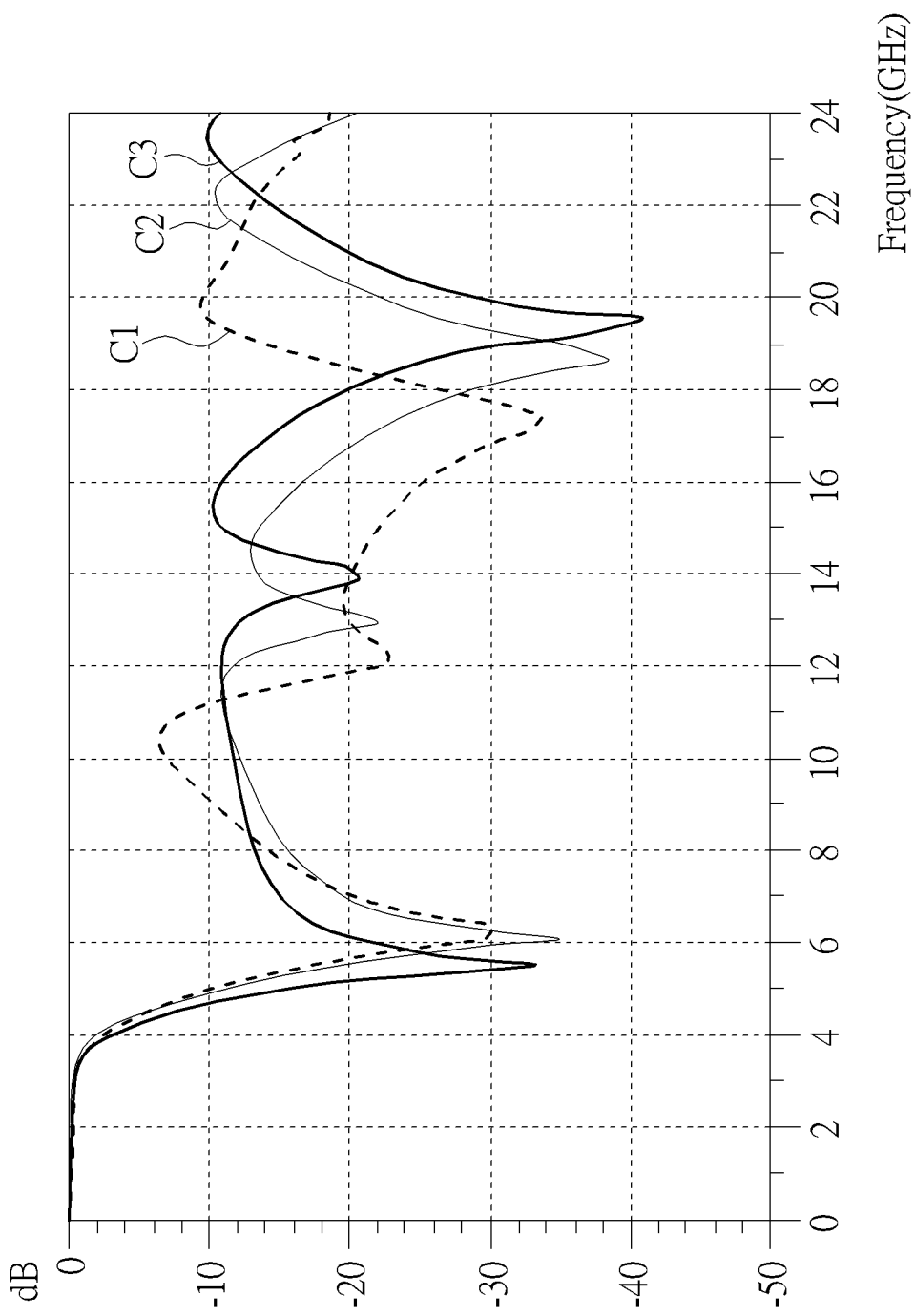
FIG. 2 shows the efficiencies of suppressing the common mode noise when the width of the first long arm and the second long arm has different values.

In some embodiments, the first long arm 122 and the second long arm 124 have the same width $W_L$, and the width $W_L$ of the first long arm 122 and the second long arm 124 can be used to determine the resonant ratio in the first resonant mode of the noise suppression filter 100 when suppressing the common mode noise. FIG. 2 shows the efficiencies of suppressing the common mode noise when the width $W_L$ of the first long arm 122 and the second long arm 124 has different values.

In FIG. 2, the curves C1, C2, and C3 are corresponding to the width $W_L$ of different values. For example, the curve C1 is corresponding to a greater width $W_L$. For the curve C1, the two resonant frequencies $f_{01}$ and $f_{03}$ in the first resonant mode are rather close. In this case, the noise suppression band width of the noise suppression filter 100 is narrower. In contrary, the curve C3 is corresponding to a smaller width $W_L$. For the curve C3, the two resonant frequencies $f_{01}$ and $f_{03}$ in the first resonant mode are rather far. In this case, the noise suppression band width of the noise suppression filter 100 is wider.

Namely, by adjusting the width $W_L$ of the first long arm 122 and the second long arm 124, the relative relationship between the two resonance frequencies $f_{01}$ and $f_{03}$ in the first resonant mode, that is, the resonant ratio of the first resonant mode, can be adjusted.

Figure 3:
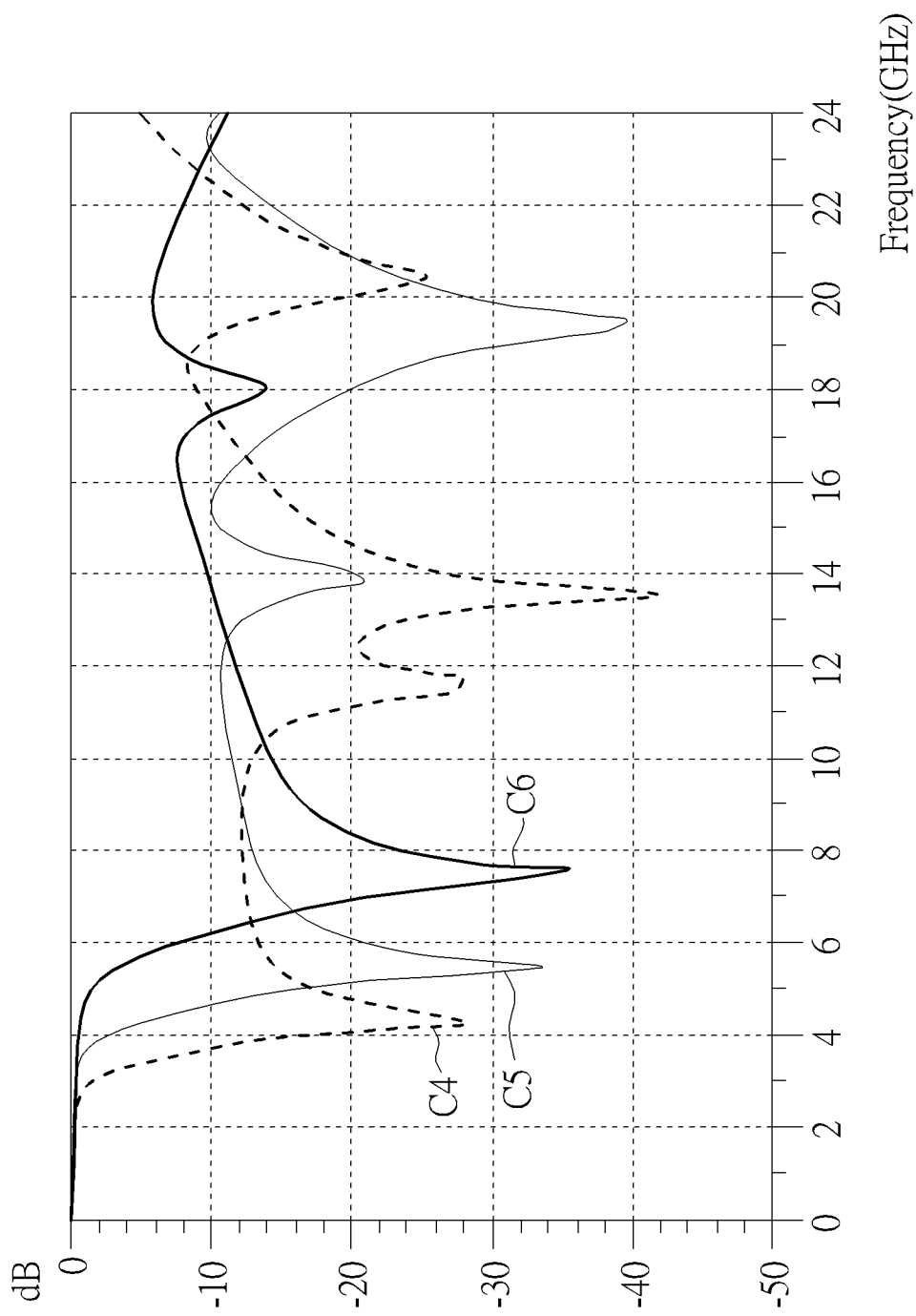
FIG. 3 shows the efficiencies of suppressing the common mode noise when the sum of the lengths of the long arms has different values.

In addition, in some embodiments, the length $L_{L1}$ of the first long arm 122 and the length $L_{L2}$ of the second long arm 124 can be the same, and the sum $L_L$ of the lengths $L_{L1}$ and $L_{L2}$ can be used to determine the first resonant frequency $f_{01}$ in the first resonant mode of the noise suppression filter 100. FIG. 3 shows the efficiencies of suppressing the common mode noise when the sum $L_L$ of the lengths $L_{L1}$ and $L_{L2}$ has different values.

In FIG. 3, the curves C4, C5, and C6 are corresponding to the sum $L_L$ of lengths of different values. For example, the curve C4 is corresponding to a greater sum $L_L$. For the curve C4, the resonant frequency $f_{01}$ in the first resonant mode is about 4 GHz. In contrary, the curve C6 is corresponding to a smaller sum $L_L$. For the curve C6, the resonant frequency $f_{01}$ in the first resonant mode is about 8 GHz.

That is, by adjusting the sum $L_L$ of lengths $L_{L1}$ and $L_{L2}$ of the first long arm 122 and the second long arm 124, the resonant frequency $f_{01}$ in the first resonant mode can also be adjusted. In some embodiments, the designer can determine the width $W_L$ of the first long arm 122 and the second long arm 124 according to the resonant ratio desired by the first resonant mode, and determine the sum $L_L$ of lengths $L_{L1}$ and $L_{L2}$ of the first long arm 122 and the second long arm 124 according to the resonant frequency desired by the first resonant mode so as to design the first resonant mode that meets the requirements of the system.

In some embodiments, the first meander line 112 and the second meander line 114 can be designed based on the shape of the resonator 120. That is, the first meander line 112 and the second meander line 114 can be respectively detoured along the inner sides of the first long arm 122 and the second long arm 124. In this case, the designer can determine the lengths and widths of the first long arm 122 and the second long arm 124, and dispose the first meander line 112 and the second meander line within the area of the first long arm 122 and the second long arm 124 while keeping a distance from the edges of the first long arm 122 and the second long arm 124. That is, in FIG. 1, the width $W_L$ can be equal to the sum of two times the widths $2W_M$ of the first meander line 112, the interval distance $S_{MA}$ of the first meander line 112 and two times the inner spacing $S_{MB}$. In some embodiments, the inner spacing $S_{MB}$ is rather small, for example but not limited to 0.2 mm.

Figure 4:
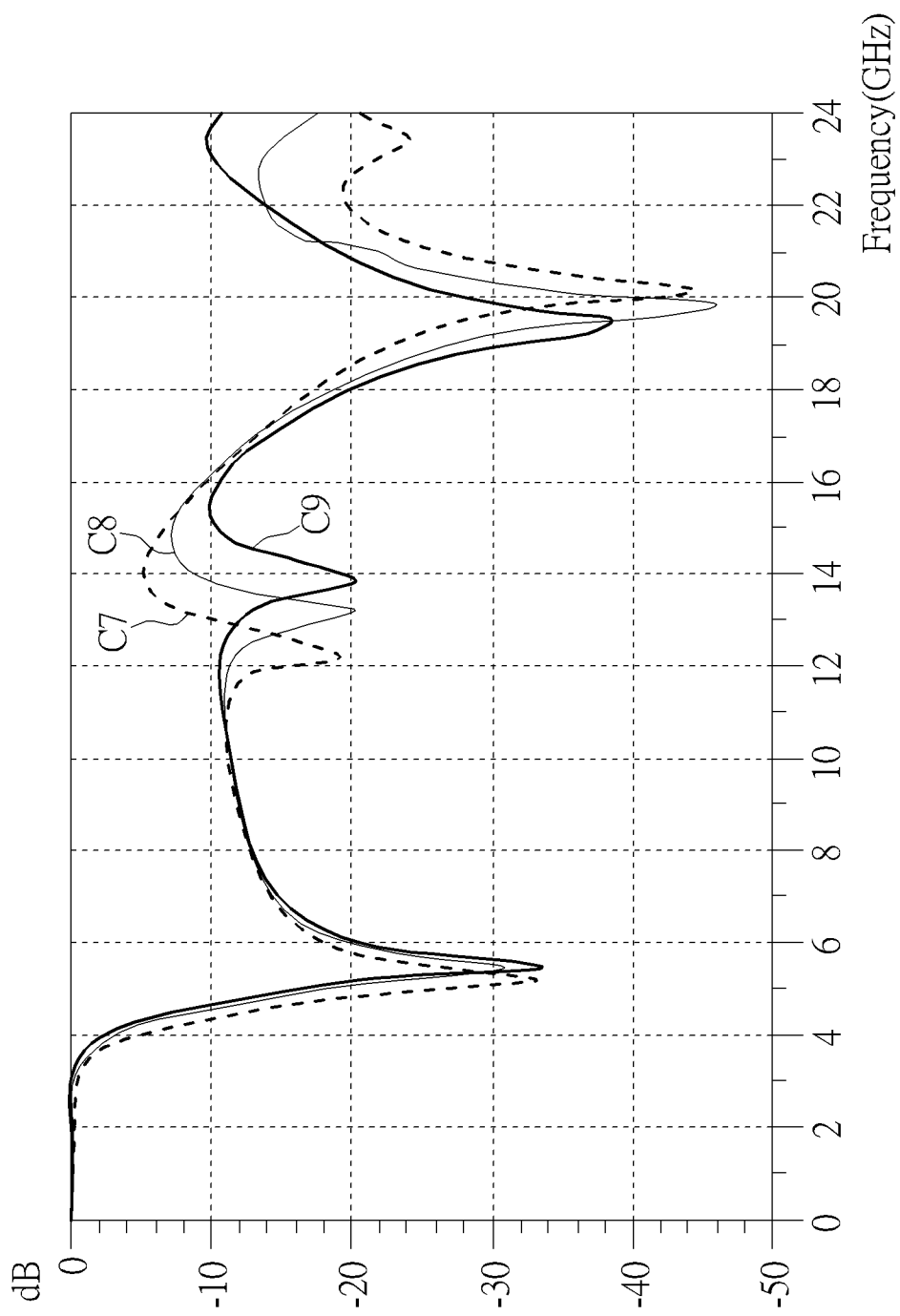
FIG. 4 shows the efficiencies of suppressing the common mode noise when the length of the short arm has different values.

Furthermore, in some embodiments, the noise suppression filter 100 can have a second resonant mode to ensure the performance of noise suppression under the frequencies between the resonant frequencies $f_{01}$ and $f_{03}$. In some embodiments, the length $L_S$ of the short arm 126 can be used to determine the resonant frequency $f_{02}$ in the second resonant mode of the noise suppression filter 100. FIG. 4 shows the efficiencies of suppressing the common mode noise when the length $L_S$ of the short arm 126 has different values.

In FIG. 4, the curves C7, C8, and C9 are corresponding the length $L_S$ of the short arm 126 of different values. For example, the curve C7 is corresponding to a greater length $L_S$. For the curve C7, the resonant frequency $f_{02}$ in the second resonant mode is about 12 GHz. In contrary, the curve C9 is corresponding to a smaller length $L_S$. For the curve C9, the resonant frequency $f_{02}$ in the second resonant mode is about 14 GHz.

That is, by adjusting the length $L_S$ of the short arm 126, the resonant frequency $f_{02}$ in the second resonant mode can also be adjusted. Also, by setting the resonant frequency $f_{02}$ of the second resonant mode properly, the frequency band that has poorer noise suppression performance in the first resonant mode can have a better noise suppression performance, allowing the performance for suppressing the common mode noise of the noise suppression filter 100 to meet the system requirement.

Furthermore, in some embodiments, the designer can also determine the length and the width of the feed line of the first output terminal OUTA and the length and the width of the feed line of the second output terminal OUTB to optimize the even mode impedance of the set of differential transmission lines 110, thereby improving the performance for suppressing the common mode noise.

Figure 5:
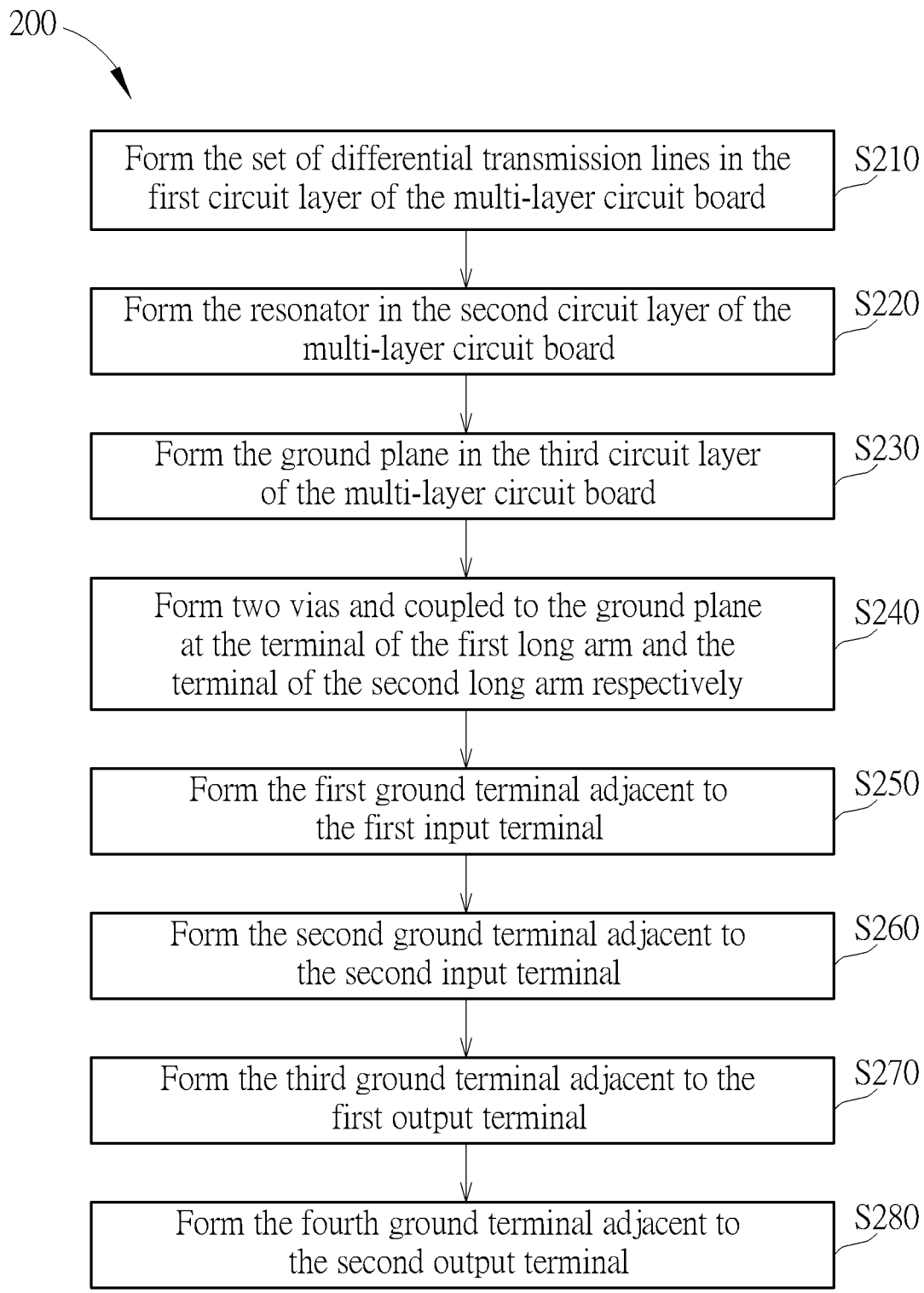
FIG. 5 shows a flowchart of a method for manufacturing the noise suppression filter in FIG. 1.

FIG. 5 shows a flowchart of a method 200 for manufacturing the noise suppression filter 100. The method 200 includes steps S210 to S280, but is not limited to the order shown in FIG. 5.

S210: form the set of differential transmission lines 110 in the first circuit layer 11 of the multi-layer circuit board 110;

S220: form the resonator 120 in the second circuit layer 12 of the multi-layer circuit board 110;

S230: form the ground plane 130 in the third circuit layer 13 of the multi-layer circuit board 110;

S240: form two vias 141 and 142 coupled to the ground plane 130 at the terminal of the first long arm 122 and the terminal of the second long arm 124 respectively;

S250: form the first ground terminal G1 adjacent to the first input terminal INA;

S260: form the second ground terminal G2 adjacent to the second input terminal INB;

S270: form the third ground terminal G3 adjacent to the first output terminal OUTA; and S280: form the fourth ground terminal G4 adjacent to the second output terminal OUTB.

In some embodiments, in step S220 when forming the resonator 120, the designer can determine the width $W_L$ of the first long arm 122 and the second long arm 124 according to the resonant ratio in the first resonant mode of the noise suppression filter 100, and determine the sum $L_L$ of the length $L_{L1}$ of the first long arm 122 and the length $L_{L2}$ of the second long arm 124 according to the first resonant frequency $f_{01}$ in the first resonant mode of the noise suppression filter 100.

Furthermore, in step S220, the designer can also determine the length $L_S$ of the short arm 126 according to the second resonant frequency $f_{02}$ in the second resonant mode of the noise suppression filter 100 so as to maintain the performance for suppressing the common mode noise in the filtering band.

In addition, the designer can not only design the meander lines 112 and 114 of the set of differential transmission lines 110 according to the shape of the resonator 120, but also determine the lengths and the widths of the feed lines at the output terminals OUTA and OUTB, thereby improving the performance for suppressing the common mode noise.

In summary, the noise suppression filters and the method for manufacturing the noise suppression filters provided by the embodiments of the present invention can be implemented in a multi-layer circuit board. Also, by choosing the lengths and the widths of the resonator properly, the desired performance for suppressing the common mode noise can be achieved. Compared with the prior art, the noise suppression filters and the method for manufacturing the noise suppression filters provided by the embodiments of the present invention can have more flexible designs and wider noise suppressing bandwidth.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A noise suppression filter comprising:
a multi-layer circuit board comprising a first circuit layer, a second circuit layer, and a third circuit layer, wherein the second circuit layer is disposed between the first circuit layer and the third circuit layer;
a resonator formed in the second circuit layer of the multi-layer circuit board and comprising a first long arm, a second long arm, and a short arm, wherein the first long arm, the second long arm, and the short arm are extended from a same point to form a T-shape;
a ground plane formed in the third circuit layer of the multi-layer circuit board, and coupled to a terminal of the first long arm and a terminal of the second long arm through two vias; and
a set of differential transmission lines formed in the first circuit layer of the multi-layer circuit board, and comprising a first meander line and a second meander line;
wherein, the first meander line is detoured from a first input terminal along an inner side of the first long arm and a first inner side of the short arm to a first output terminal, and the second meander line is detoured from a second input terminal along an inner side of the second long arm and a second inner side of the short arm to a second output terminal.

2. The noise suppression filter of claim 1 further comprising:
a first ground terminal formed adjacent to the first input terminal and coupled to the ground plane through a first via;
a second ground terminal formed adjacent to the second input terminal and coupled to the ground plane through a second via;
a third ground terminal formed adjacent to the first output terminal and coupled to the ground plane through a third via; and
a fourth ground terminal formed adjacent to the second output terminal and coupled to the ground plane through a fourth via;
wherein the first input terminal and the second input terminal are disposed between the first ground terminal and the second ground terminal, and the first output terminal and the second output terminal are disposed between the third ground terminal and the fourth ground terminal.

3. The noise suppression filter of claim 1, wherein a width of the first long arm and a width of the second long arm are the same, and the width of the first long arm and the width of the second long arm are configured to determine a resonant ratio in a first resonant mode of the noise suppression filter.

4. The noise suppression filter of claim 1, wherein a sum of a length of the first long arm and a length of the second long arm is configured to determine a first resonant frequency in a first resonant mode of the noise suppression filter.

5. The noise suppression filter of claim 1, wherein a length of the short arm is configured to determine a second resonant frequency in a second resonant mode of the noise suppression filter.

6. A method for manufacturing a noise suppression filter comprising:
forming a set of differential transmission lines in a first circuit layer of a multi-layer circuit board;
forming a resonator in a second circuit layer of the multi-layer circuit board, wherein the resonator comprises a first long arm, a second long arm, and a short arm extended from a same point to form a T-shape;
forming a ground plane in a third circuit layer of the multi-layer circuit board; and
forming two vias coupled to the ground plane at a terminal of the first long arm and a terminal of the second long arm;
wherein:

the second circuit layer is disposed between the first circuit layer and the third circuit layer;

the set of differential transmission lines comprises a first meander line detoured from a first input terminal along an inner side of the first long arm and a first inner side of the short arm to a first output terminal; and the set of differential transmission lines further comprises a second meander line detoured from a second input terminal along an inner side of the second long arm and a second inner side of the short arm to a second output terminal.

7. The method for manufacturing the noise suppression filter of claim 6 further comprising:

forming a first ground terminal adjacent to the first input terminal, the first ground terminal being coupled to the ground plane;

forming a second ground terminal adjacent to the second input terminal, the second ground terminal being coupled to the ground plane;

forming a third ground terminal adjacent to the first output terminal, and the third ground terminal being coupled to the ground plane;

forming a fourth ground terminal adjacent to the second output terminal, and the fourth ground terminal being coupled to the ground plane;

wherein the first input terminal and the second input terminal are disposed between the first ground terminal and the second ground terminal, and the first output terminal and the second output terminal are disposed between the third ground terminal and the fourth ground terminal.

8. The method for manufacturing the noise suppression filter of claim 6, wherein the step of forming the resonator in the second circuit layer of the multi-layer circuit board comprises:

determining a width of the first long arm and a width of the second long arm according to a resonant ratio in a first resonant mode of the noise suppression filter; and determining a sum of a length of the first long arm and a length of the second long arm according to a first resonant frequency in the first resonant mode of the noise suppression filter.

9. The method for manufacturing the noise suppression filter of claim 6, wherein the step of forming the resonator in the second circuit layer of the multi-layer circuit board comprises:

determining a length of the short arm according to a second resonant frequency in a second resonant mode of the noise suppression filter to maintain performance of common mode noise suppression of the noise suppression filter.

10. The method for manufacturing the noise suppression filter of claim 6, wherein the step of forming the set of differential transmission lines in the first circuit layer of the multi-layer circuit board comprises:

determining a length and a width of the first output terminal and a length and a width of the second output terminal to optimize an even mode impedance of the set of differential transmission lines.

\* \* \* \* \*